(12) United States Patent
Hsu et al.

(10) Patent No.: US 12,009,949 B2
(45) Date of Patent: Jun. 11, 2024

(54) SIGNAL RECEIVER

(71) Applicant: Novatek Microelectronics Corp., Hsinchu (TW)

(72) Inventors: Hao-Che Hsu, Hsinchu (TW); Chin-Tung Chan, New Taipei (TW); Ying-Cheng Lin, Taoyuan (TW); Ren-Hong Luo, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 111 days.

(21) Appl. No.: 17/501,985

(22) Filed: Oct. 14, 2021

(65) Prior Publication Data
US 2023/0121521 A1    Apr. 20, 2023

(51) Int. Cl.
H04L 25/02    (2006.01)
H03F 3/45    (2006.01)

(52) U.S. Cl.
CPC ..... H04L 25/0272 (2013.01); H03F 3/45076 (2013.01); H04L 25/028 (2013.01)

(58) Field of Classification Search
CPC ............... H04L 25/0272; H04L 25/028; H03F 3/45076
USPC .......................................... 375/262
See application file for complete search history.

(56) References Cited

U.S. PATENT DOCUMENTS

| | | | | |
|---|---|---|---|---|
| 5,731,742 A * | 3/1998 | Wojewoda | ............... | H03L 1/023 331/177 V |
| 2004/0038657 A1* | 2/2004 | Bae | ...................... | H04B 17/318 455/226.2 |
| 2006/0284671 A1* | 12/2006 | Ohba | .................. | H03F 3/45977 330/9 |
| 2018/0061307 A1* | 3/2018 | Inoue | .................. | H03F 3/45183 |
| 2019/0348958 A1 | 11/2019 | BenSaleh et al. | | |
| 2020/0295721 A1* | 9/2020 | Kitazawa | ............ | H04L 25/0294 |
| 2021/0099172 A1* | 4/2021 | Kang | .................. | H03K 19/0005 |

FOREIGN PATENT DOCUMENTS

JP    2015008423    1/2015

OTHER PUBLICATIONS

Xu Bai, et al., "A 2.5 Gbps, 10-Lane, Low-Power, LVDS Transceiver in 28 nm CMOS Technology", Electronics 2019, 8(3), 350, Mar. 22, 2019, pp. 1-9.

* cited by examiner

Primary Examiner — Kevin M Burd
(74) Attorney, Agent, or Firm — JCIPRNET

(57) ABSTRACT

A signal receiver includes a first transistor, a second transistor, a load circuit, an amplifying circuit and a load circuit. The first transistor has a first end receiving a power voltage, and a control end receive a first input signal. The second transistor has a first end receiving the power voltage, and a control end receiving a second input signal, wherein the first input signal and the second input signal are differential signals and transit between a first voltage and a reference ground voltage, the first voltage is larger than the power voltage. The load circuit is coupled to the first transistor and the second transistor. The amplifying circuit generates an output signal according a first signal on the second end of the first transistor and a second signal on the second end of the second transistor.

13 Claims, 6 Drawing Sheets

SIGNAL RECEIVER

BACKGROUND

Field of the Invention

The invention relates to a signal receiver and more particularly, to a signal receiver with wide common-mode voltage range for low voltage differential signals (LVDS).

Description of Related Art

A signal receiver for processing low voltage differential signals (LVDS) is widely used. For saving power consumption, a power voltage of the signal receiver is usually reduced, but input signals may have a higher common-mode voltage, and a signal distortion happened in the signal processing by the signal receiver. In a conventional art, a level shift circuit is always necessary for adjusting the common-mode voltage of the input signal pair. Such as that, a larger circuit size and more power consumption for the signal receiver are necessary.

SUMMARY

The invention provides a signal receiver for processing low voltage differential signals (LVDS) with wide common-mode voltage range.

According to an embodiment of the invention, the signal receiver includes: a first transistor, a second transistor, a load circuit, an amplifying circuit and a load circuit. The first transistor has a first end receiving a power voltage, and a control end receive a first input signal. The second transistor has a first end receiving the power voltage, and a control end receiving a second input signal, wherein the first input signal and the second input signal are differential signals and transit between a first voltage and a reference ground voltage, the first voltage is larger than the power voltage. The load circuit is coupled to second ends of the first transistor and the second transistor. The amplifying circuit is coupled to the second ends of the first transistor and the second transistor and generates an output signal according a first signal on the second end of the first transistor and a second signal on the second end of the second transistor.

To sum up, the signal receiver provides the transistor and the second transistor to be operated in common drain configuration. A differential signal pair including the first input signal and the second input signal may has a first common-mode voltage larger than a power voltage of the signal receiver, and the first input signal and the second input signal can be respectively received by the first transistor and the second transistor. The load circuit is configured to adjust a second common-mode voltage of the first signal and the second signal received by the amplifying circuit. Such as that, an output signal swing between the power voltage and a ground voltage can be generated by the amplifying circuit.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
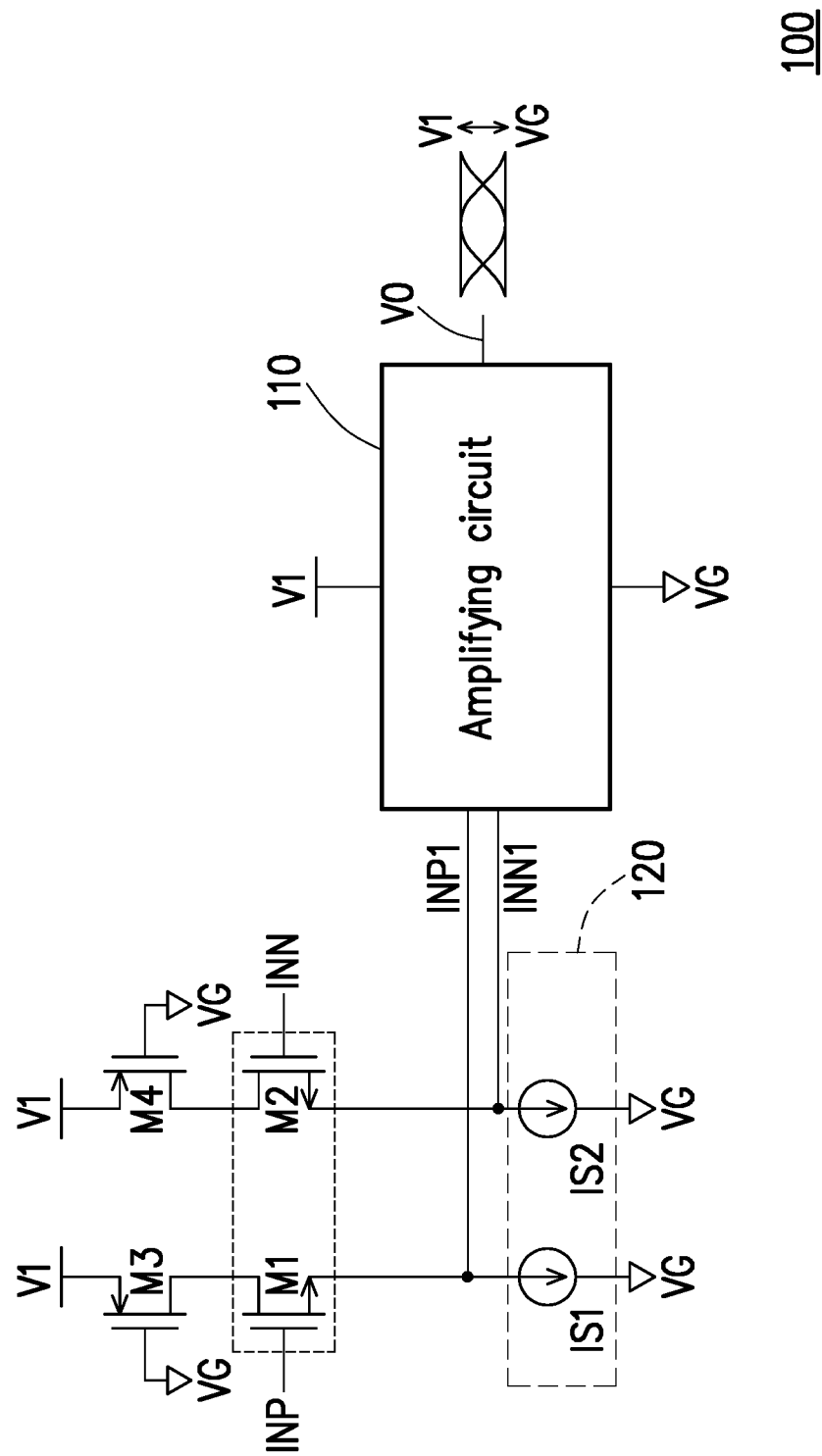
FIG. 1 illustrates a schematic diagram of a signal receiver according to an embodiment of present disclosure.

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

Please refer to FIG. 1, which illustrates a schematic diagram of a signal receiver according to an embodiment of present disclosure. The signal receiver 100 includes a first transistor M1, a second transistor M2, a third transistor M3, a fourth transistor M4, an amplifying circuit 110 and a load circuit 120. The third transistor M3 has a first end receiving a power voltage V1 of the signal receiver 100, the third transistor M3 has a control end receiving a reference ground voltage VG, and the third transistor M3 has a second end being coupled to a first end of the first transistor M1. The fourth transistor M4 has a first end receiving the power voltage V1 of the signal receiver 100, the fourth transistor M4 has a control end receiving the reference ground voltage VG, and the fourth transistor M4 has a second end being coupled to a first end of the second transistor M2.

The first transistor M1 has a control end receiving a first input signal INP, and the first transistor M1 has a second end being coupled to the load circuit 120. The second transistor M2 has a control end receiving a second input signal INN, and the second transistor M2 has a second end being coupled to the load circuit 120. The first input signal INP and the second input signal INN form a differential signal pair. In this embodiment, a common-mode voltage (first common-mode voltage) of the first input signal INP and the second input signal INN may be larger than the power voltage V1.

Also, in this embodiment, the first transistor M1 and the second transistor M2 may be metal-oxide-semiconductor field-effect transistors with higher voltage endurance than other transistors in the signal receiver 100. For example, if the power voltage V1 is 1.1 volts, the voltage endurance of the first transistor M1 and the second transistor M2 may be 1.8 volts.

The load circuit 120 includes a first current source IS1 and a second current source IS2. The first current source IS1 is coupled between the second end of the first transistor M1 and the reference ground voltage VG. The second current source IS2 is coupled between the second end of the second transistor M2 and the reference ground voltage VG. In this embodiment, the first end of the first transistor M1 is a drain, the first end of the second transistor M2 is a drain, and both of the first transistor M1 and the second transistor M2 form a common drain configuration.

On the other hand, the first current source IS1 is used to draw a first current from the second end of the first transistor M1. The first current source IS1 can reduce a voltage drop between the control end and the second end of the first transistor M1. Also, the second current source IS2 is used to draw a second current from the second end of the second transistor M2. The second current source IS2 can reduce a voltage drop between the control end and the second end of the second transistor M2.

Since the first transistor M1 and the second transistor M2 have high voltage endurance, both of the first input signal INP and the second input signal INN respectively received by the first transistor M1 and the second transistor M2 may transit between a first voltage and the reference ground voltage VG, wherein the first voltage is larger than the power voltage V1 and a common-mode voltage (first common-mode voltage) of the first input signal INP and the second input signal INN may be higher than the power voltage V1, too. The second end of the first transistor M1 generates a first signal INP1, and the second end of the first transistor M2 generates a second signal INN1, wherein both of the first signal INP1 and the second signal INN1 transit between the power voltage V1 and the reference ground voltage VG.

The signals INP1 and INN1 form a differential signal pair, and are transmitted to the amplifying circuit 110. The amplifying circuit 110 receives the power voltage V1 as an operation power. The amplifying circuit 110 generates an output signal VO by amplifying a voltage difference of the first signal INP1 and the second signal INN1. The output signal VO can transit between the power voltage V1 and the reference ground voltage VG.

Figure 2:
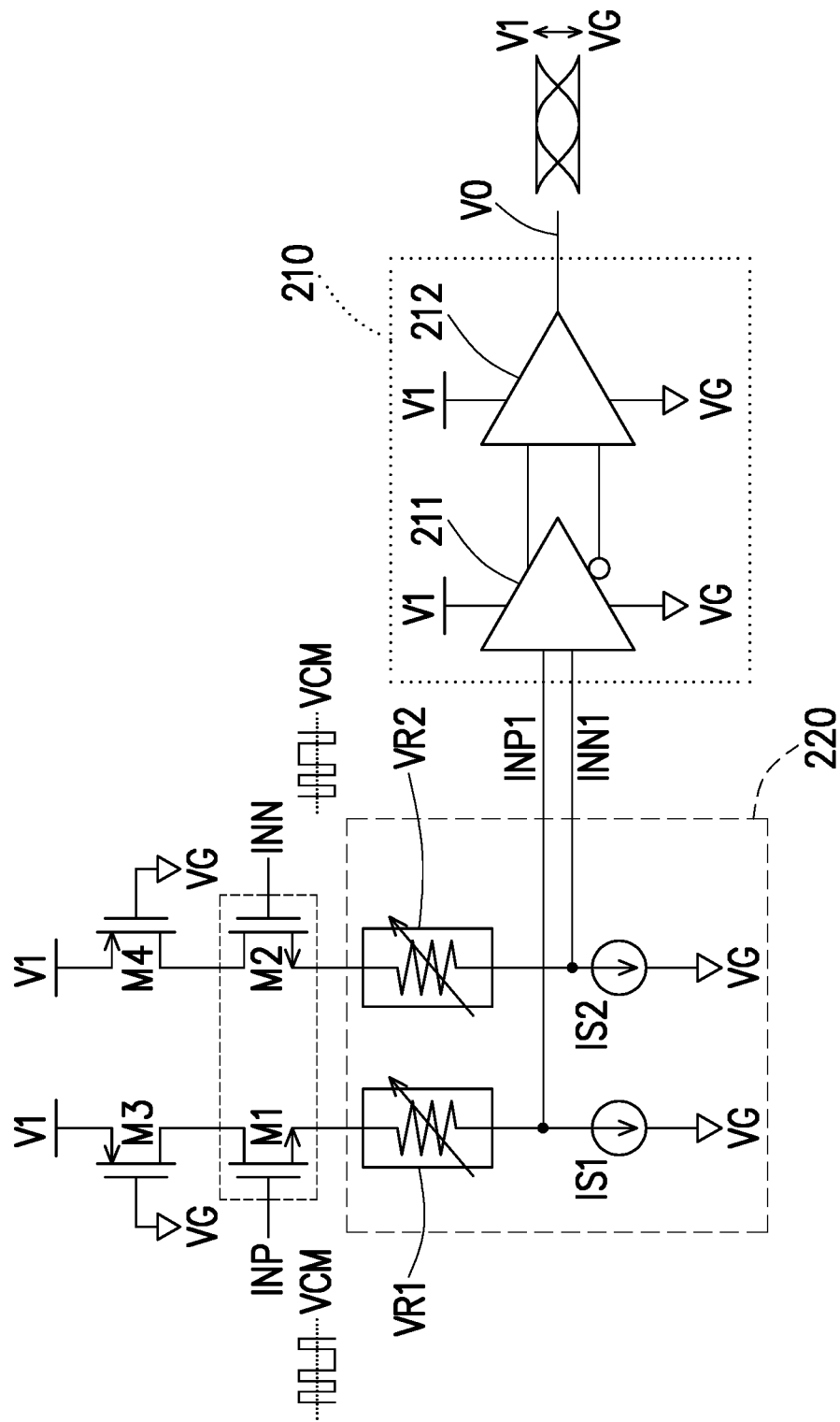
FIG. 2 illustrates a schematic diagram of a signal receiver according to another embodiment of present disclosure.

Please refer to FIG. 2, which illustrates a schematic diagram of a signal receiver according to another embodiment of present disclosure. The signal receiver 200 includes a first transistor M1, a second transistor M2, a third transistor M3, a fourth transistor M4, an amplifying circuit 210 and a load circuit 220. A connection relationship of the first transistor M1 to the fourth transistor M4 in this embodiment is similar to the embodiment in FIG. 1, and no more repeated description here. It should be noted here, in this embodiment, the first input signal INP and the second input signal INN are respectively inputted into control ends of the first transistor M1 and the second transistor M2. The first input signal INP and the second input signal INN are differential signals and have a common-mode voltage VCM (first common-mode voltage). The common-mode voltage VCM may be, but not necessary, larger than the power voltage V1.

Different from the embodiment in FIG. 1, in this embodiment, the load circuit 220 includes a first resistor VR1, a second resistor VR2, a first current source IS1 and a second current source IS2. The first resistor VR1 and the first current source IS1 are serial coupled between a second end of the first transistor M1 and a reference ground voltage VG, wherein the first resistor VR1 is coupled between the second end of the first transistor M1 and the first current source IS1. The second resistor VR2 and the second current source IS2 are serial coupled between a second end of the second transistor M2 and the reference ground voltage VG, wherein the second resistor VR2 is coupled between the second end of the second transistor M2 and the second current source IS2. In this embodiment, a first signal INP1 can be generated on a coupling end of the first resistor VR1 and the first current source IS1, and a second signal INN1 can be generated on a coupling end of the second resistor VR1 and the second current source IS1.

It should be noted here, a voltage level of the first signal INP1 can be set according to a resistance of the first resistor VR1, and a voltage level of the second signal INN1 can be set according to a resistance of the second resistor VR2. In one embodiment, each of the first resistor VR1 and the second resistor VR2 may be formed by a variable resistor, such that resistances of the first resistor VR1 and the second resistor VR2 can be adjusted to determine a fixed resistance, which lets a common-mode voltage (second common-mode voltage) of the first signal INP1 and the second signal INN1 be in an optimal operation range such that the first transistor M1, the second transistor M2, the third transistor M3 and the fourth transistor M4 stays in the active state. In other words, the voltage levels of the first signal INP1 and the second signal INN1 can be determined by adjusting the resistances of the first resistor VR1 and the second resistor VR2, respectively. Such as that, the common-mode voltage (second common-mode voltage) of the first signal INP1 and the second signal INN1 can be determined by adjusting the resistances of the first resistor VR1 and the second resistor VR2.

The amplifying circuit 210 includes a first amplifier 211 and a second simplifier 212. The first amplifier 211 receives the power voltage V1 and the reference ground voltage VG to be operation voltage. The first amplifier 211 also receives the first signal INP1 and the second signal INN1 as input signals, and generates an output signal pair according to the first signal INP1 and the second signal INN1. In this embodiment, the first amplifier 211 may be a rail to rail amplifier, and the output signal pair can have full swing between the power voltage V1 and the reference ground voltage VG.

The second amplifier 212 receives the output signal pair from the first amplifier 211. The second amplifier 212 may be a differential-in and single-ended output amplifier, and is used to generate an output signal VO according to the output signal pair, wherein the output signal VO can transit between the power voltage V1 and the reference ground voltage VG.

About hardware structures of the first amplifier 211 and the second amplifier 212, any rail to rail amplifying circuit well known by a person skilled in this art can be used to implement the first amplifier 211, and any differential-in and single-ended output amplifying circuit well known by a person skilled in this art can be used to implement the second amplifier 212, and no more special limitation here.

Figure 3:
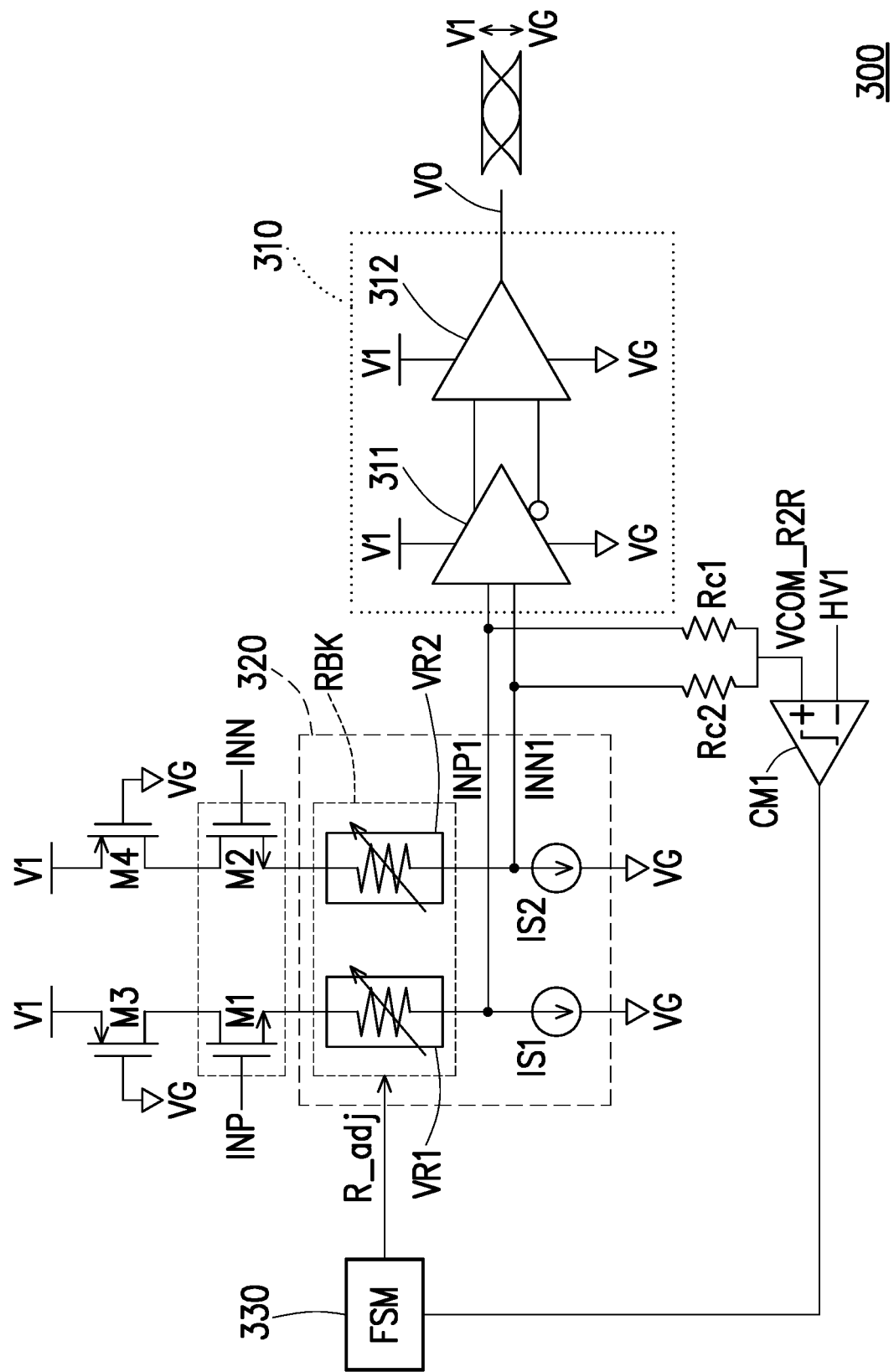
FIG. 3 illustrates a schematic diagram of a signal receiver according to another embodiment of present disclosure.

Please refer to FIG. 3, which illustrates a schematic diagram of a signal receiver according to another embodiment of present disclosure. The signal receiver 300 includes a first transistor M1, a second transistor M2, a third transistor M3, a fourth transistor M4, an amplifying circuit 310, a load circuit 320, resistors Rc1, Rc2, a voltage comparator CM1 and a finite state machine (FSM) 330.

In here, a connection relationship of the first transistor M1 to the fourth transistor M4 in this embodiment is similar to the embodiment in FIG. 1.

The load circuit 320 includes a first resistor VR1, a second resistor VR2, a first current source IS1 and a second current source IS2. In here, the first resistor VR1 and the second resistor VR2 may form a resistor bank RBK, and each of the first resistor VR1 and the second resistor VR2 may be formed by a variable resistor. Detail operation of the load circuit 320 is similar to the load circuit 220 in FIG. 2, and no more description here. The amplifying circuit 310 includes a first amplifier 311 and a second amplifier 312, wherein the first amplifier 311 may be a rail to rail amplifier and the second amplifier 312 may be a differential-in and single-ended output amplifier. Detail operation of the amplifying circuit 310 is similar to the load circuit 210 in FIG. 2, and no more description here.

In this embodiment, the voltage comparator CM1 and the FSM 330 are utilized for dynamically adjusting the resistances of the first resistor VR1 amd the second resistor VR2 to make a common-mode voltage VCM_R2R, which follows the common-mode voltage (second common-mode voltage) of the first signal INP1 and the second signal INN1, close to a reference voltage HV1. The resistors Rc1 has a first terminal coupled to a second end of the first transistor M1 through the first resistor VR1, and the resistor Rc2 has a first terminal coupled to a second end of the second transistor M2 through the second resistor VR2. A second terminal of the resistor Rc1 and a second terminal of the resistor Rc2 are coupled together. The resistors Rc1 and Rc2 may be used to carry out the common-mode voltage VCOM_R2R of a first signal INP1 and a second signal INN1, wherein the first signal INP1 and the second signal INN1 are respectively generated from the first resistor VR1 and the second resistor VR2.

The voltage comparator CM1 has a first input terminal coupled to the second terminal of the resistor Rc1 and the second terminal of the resistor Rc2 to receive the common-mode voltage VCOM_R2R. The voltage comparator CM1 also has a second input terminal for receiving a reference voltage HV1. The voltage comparator CM1 is configured to generate a control signal by comparing the common-mode voltage VCOM_R2R with the reference voltage HV1. In this embodiment, the first input terminal of the voltage comparator CM1 may be a positive input terminal, the second input terminal of the voltage comparator CM1 may be a negative input terminal, and the reference voltage HV1 may equal $(V1-VG)/2$.

On the other hand, the FSM 330 is coupled between the voltage comparator CM1 and the load circuit 320. The FSM 330 receives the control signal from the voltage comparator CM1, and generates an adjusting signal R_adj by performing a logic operation on the control signal. The adjusting signal R_adj is transmitted to the first resistor VR1 and the second resistor VR2 to control resistances of the first resistor VR1 and the second resistor VR2.

Figure 4:
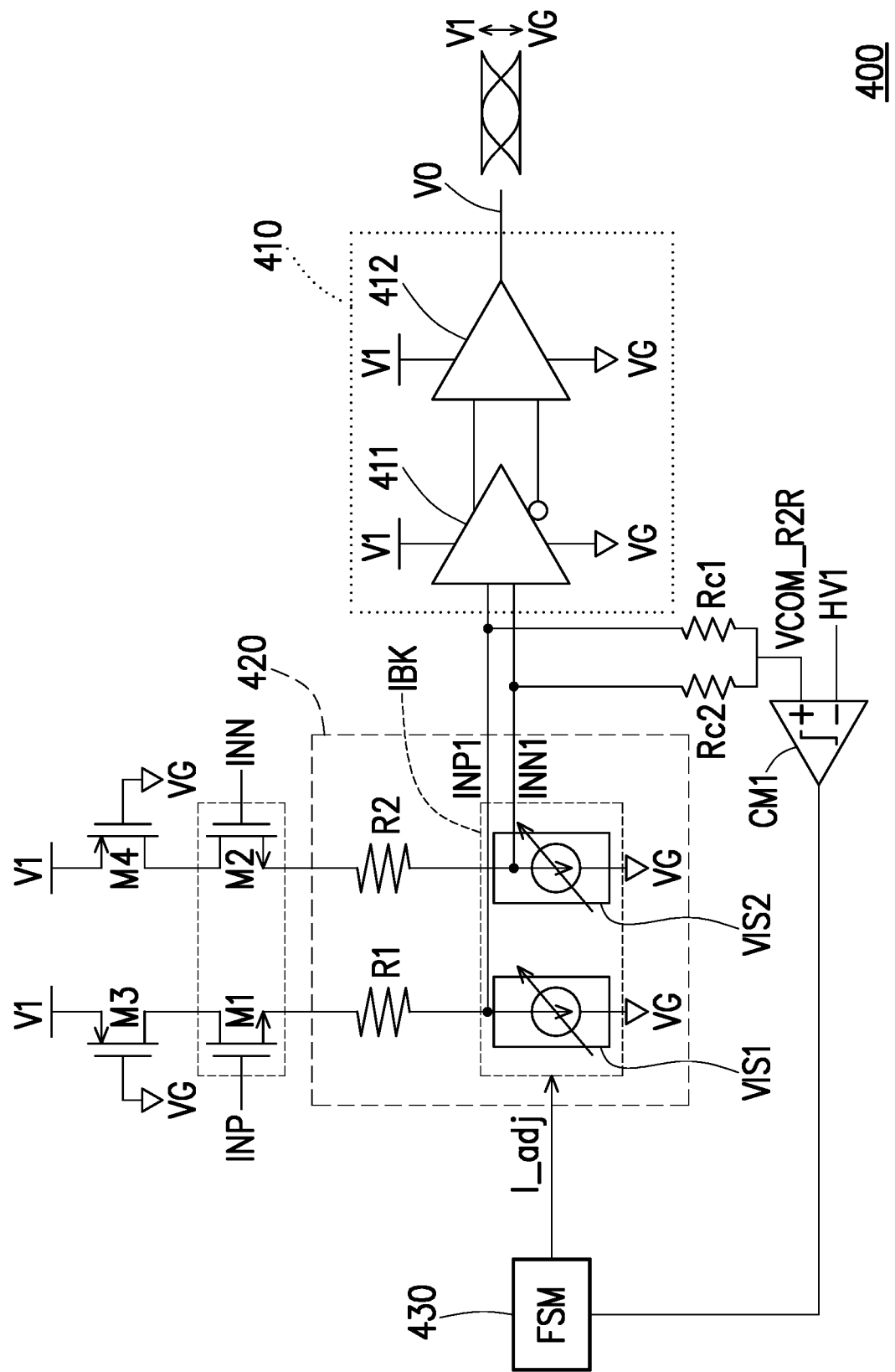
FIG. 4 illustrates a schematic diagram of a signal receiver according to another embodiment of present disclosure.

In detail, if the control signal indicates the common-mode voltage VCOM_R2R is larger than the reference voltage, the FSM 330 can generate the adjusting signal R_adj to increase the resistance of the first resistor VR1 and the second resistor VR2. On the contrary, if the control signal indicates the common-mode voltage VCOM_R2R is smaller than the reference voltage, the FSM 330 can generate the adjusting signal R_adj to decrease the resistance of the first resistor VR1 and the second resistor VR2. Increasing/decreasing the resistance of the first resistor VR1 and the second resistor VR2 may be performed until the common-mode voltage VCOM_R2R becomes approximate to the reference voltage HV1. Besides, if the common-mode voltage VCOM_R2R equals the reference voltage HV1, or is close enough to the reference voltage HV1, which means a difference between the common-mode voltage VCOM_R2R and the reference voltage HV1 are quite small no matter the common-mode voltage VCOM_R2R is larger or smaller than the reference voltage HV1, the FSM 330 may not to generate the adjusting signal R_adj to adjust the resistances of the first resistor VR1 and the second resistor VR2. Please refer to FIG. 4, which illustrates a schematic diagram of a signal receiver according to another embodiment of present disclosure. The signal receiver 400 includes a first transistor M1, a second transistor M2, a third transistor M3, a fourth transistor M4, an amplifying circuit 410, a load circuit 420, resistors Rc1, Rc2, a voltage comparator CM1 and a finite state machine (FSM) 430.

In here, a connection relationship of the first transistor M1 to the fourth transistor M4 in this embodiment is similar to the embodiment in FIG. 1.

The amplifying circuit 410 includes a first amplifier 411 and a second amplifier 412, wherein the first amplifier 411 may be a rail to rail amplifier and the second amplifier 412 may be a differential-in and single-ended output amplifier. Detail operation of the amplifying circuit 410 is similar to the load circuit 210 in FIG. 2, and no more description here.

The load circuit 420 includes a first resistor R1, a second resistor R2, a first current source VIS1 and a second current source VIS2. The first current source VIS1 and the second current source VIS2 may form a current source bank IBK. In this embodiment, the first resistor R1 is coupled between the first current source VIS1 and the first transistor M1, and the second resistor R2 is coupled between the second current source VIS2 and the second transistor M2. Resistances of the first resistor R1 and the second resistor R2 are constant, and currents generated by the first current source VIS1 and the second current source VIS2 are adjustable.

The voltage comparator CM1 and the FSM 430 are utilized for dynamically adjusting currents of the first current source VIS1 and the second current source VIS2 to make a common-mode voltage VCM_R2R, which follows the common-mode voltage (second common-mode voltage) of the first signal INP1 and the second signal INN1, close to a reference voltage HV1. The voltage comparator CM1 has a positive input terminal coupled to the second terminal of the resistor Rc1 and the second terminal of the resistor Rc2 to receive the common-mode voltage VCOM_R2R. The voltage comparator CM1 also has a negative input terminal for receiving a reference voltage HV1. The voltage comparator CM1 is configured to generate a control signal by comparing the common-mode voltage VCOM_R2R with the reference voltage HV1. In this embodiment, the reference voltage HV1 may equal $(V1-VG)/2$.

In this embodiment, the FSM 430 receives the control signal from the voltage comparator CM1, and generates an adjusting signal I_adj by performing a logic operation on the control signal. The adjusting signal I_adj is transmitted to the first current source VIS1 and the second current source VIS2 to control currents outputted from the first current source VIS1 and the second current source VIS2. The adjusting signal I_adj may be a digital signal with one or a plurality of bits. Currents of the first current source VIS1 and the second current source VIS2 may be adjusted according to digital value of the adjusting signal I_adj.

In detail, if the control signal indicates the common-mode voltage VCOM_R2R is larger than the reference voltage, the FSM 430 can generate the adjusting signal I_adj to increase the currents of the first current source VIS1 and the second current source VIS2. On the contrary, if the control signal indicates the common-mode voltage VCOM_R2R is smaller than the reference voltage, the FSM 430 can generate the adjusting signal I_adj to decrease the currents of the first current source VIS1 and the second current source VIS2. Increasing/decreasing the currents of the first current source VIS1 and the second current source VIS2 may be performed until the common-mode voltage VCOM_R2R becomes approximate to the reference voltage HV1.

Figure 5A:
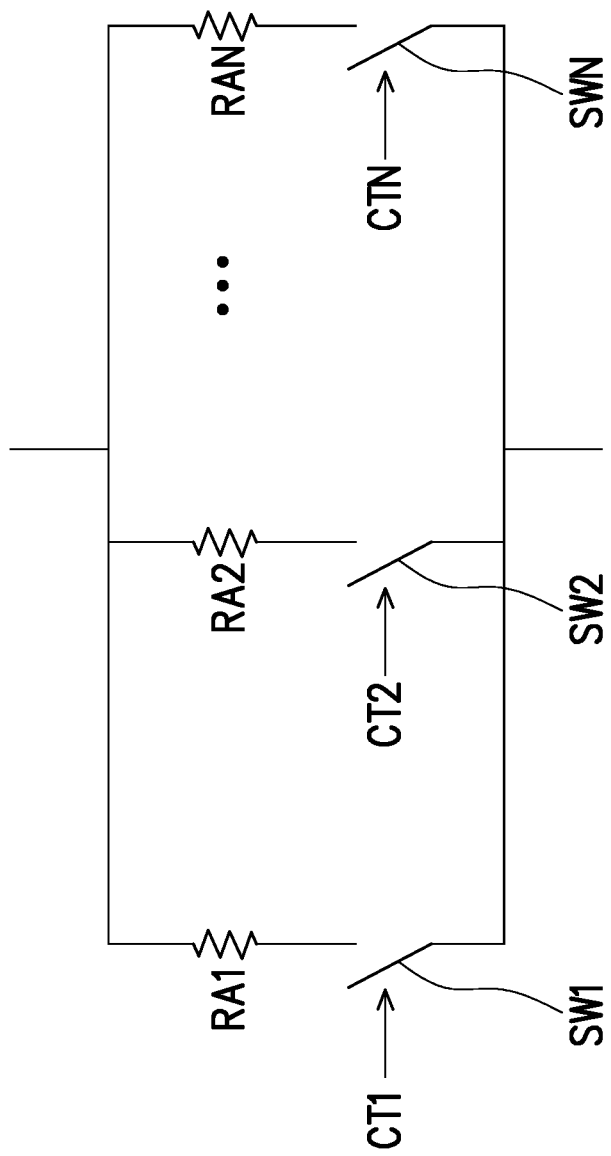
FIG. 5A and FIG. 5B illustrates schematic diagram of a variable resistor according to the embodiment of FIG. 3 in present disclosure.
Figure 5B:
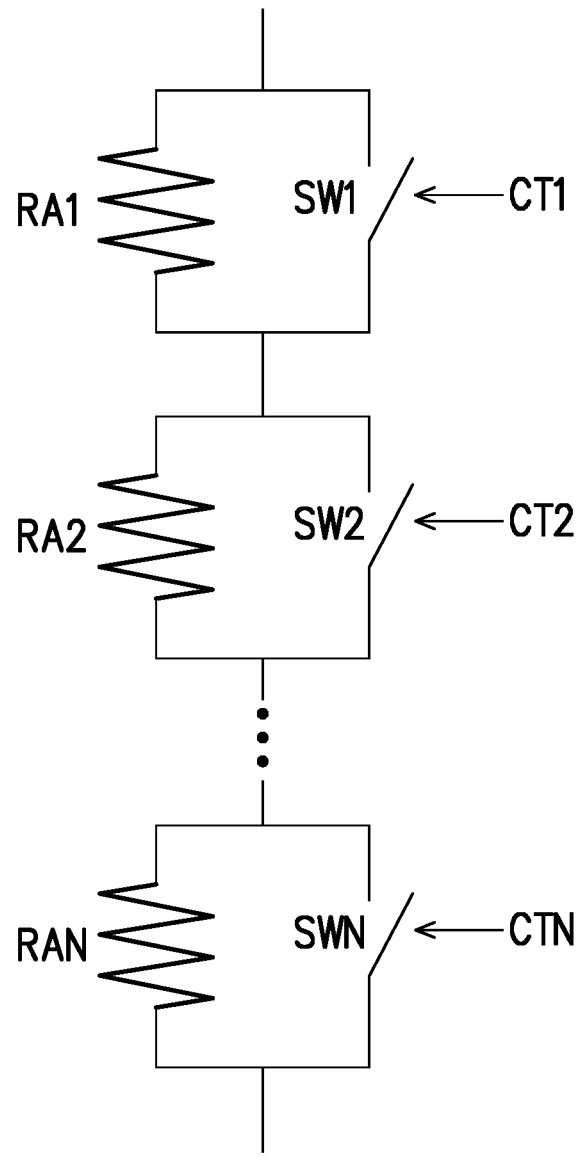

Please refer to FIG. 5A and FIG. 5B, which illustrates schematic diagram of a variable resistor according to the embodiment of FIG. 3 in present disclosure. In FIG. 5A, a variable resistor 510 includes a plurality of unit resistors RA1-RAN and a plurality of switches SW1-SWN. The unit resistors RA1-RAN are respectively coupled to the switches SW1-SWN in series to form a plurality of resistor and switch strings. The resistor and switch strings are coupled in parallel. The switches SW1-SWN are respectively controlled to be turned-on or cut-off by a plurality of bits CT1-CTN of the adjusting signal R_adj as shown in FIG. 3. In this embodiment, resistance of each of the unit resistors RA1-RAN may be different. In one case, ration of resistances of the unit resistors RA1-RAN may be $2^0:2^1:2^2:2^3:\ldots:2^{N-1}$. One of the switches SW1-SWN can be turned on to select corresponding unit resistors RA1-RAN to provide a resistance for the variable resistor 510. The resistance of the variable resistor 510 can be adjusted by changing the turned-on switch. In another embodiment, resistance of each of the unit resistors RA1-RAN may be the same. The resistance of the variable resistor 510 can be determined by a turned-on number (or a cut-off number) of the switches SW1-SWN.

In FIG. 5B, a variable resistor 520 includes a plurality of unit resistors RA1-RAN and a plurality of switches SW1-SWN. The unit resistors RA1-RAN are coupled ion series, and the unit resistors RA1-RAN are respectively coupled to the switches SW1-SWN in parallel. The switches SW1-SWN are respectively controlled to be turned-on or cut-off by a plurality of bits CT1-CTN of the adjusting signal R_adj as shown in FIG. 3. In this embodiment, resistance of each of the unit resistors RA1-RAN may be same or different. A resistance of the variable resistor 520 can be determined by a turned-on number (or a cut-off number) of the switches SW1-SWN. If all of the switches SW1-SWN are cut off, the resistance of the variable resistor 520 equals RA1+RA2+ . . . +RAN. If only one switch (i.e. switch SW1) is cut-off, and others switches SW2-SWN are turned-on, the resistance of the variable resistor 520 equals RA1.

In summary, the present disclosure provides two transistors of an input pair with higher voltage endurance to receive differential input signals. The two transistors of the input pair form common drain configuration. The load circuit generates two output signals being as differential input signals which has a common-mode voltage of an appropriate level, and an output signal can be generated by amplifying the differential input signals by two amplifiers. Such as that, the signal receiver of present disclosure can process the differential input signals with wide range common-mode voltage. An efficiency of the signal receiver can be improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A signal receiver, comprising:
a first transistor, having a first end receiving a power voltage, and a control end receiving a first input signal;
a second transistor, having a first end receiving the power voltage, and a control end receiving a second input signal, wherein the first input signal and the second input signal are differential signals and transit between a first voltage and a reference ground voltage, the first voltage is larger than the power voltage;
a load circuit, coupled to second ends of the first transistor and the second transistor;
an amplifying circuit, coupled to the second ends of the first transistor and the second transistor and generating an output signal according a first signal on the second end of the first transistor and a second signal on the second end of the second transistor;
wherein the load circuit comprises:
a first current source and a first resistor, coupled in series between the second end of the first transistor and the reference ground voltage, wherein the first current source is configured to draw a first current from the second end of the first transistor, and a voltage level of a first node which the first current source and the first resistor are coupled to determines a voltage level of the first signal;
a second current source and a second resistor, coupled in series between the second end of the second transistor and the reference ground voltage, wherein the second current source is configured to draw a second current from the second end of the second transistor, and a voltage level of a second node which the second current source and the second resistor are coupled to determines a voltage level of the second signal;
wherein either resistances of the first resistor and the second resistor or currents of the first current source and the second current source are variable and controlled by an adjusting signal generated according to a common-mode voltage of the first signal and the second signal.

2. The signal receiver as claimed in claim 1, wherein the first transistor and the second transistor are metal-oxide-semiconductor field-effect transistors with a voltage endurance higher than the power voltage.

3. The signal receiver as claimed in claim 2, wherein the first end of the first transistor is a drain of the first transistor, the first end of the second transistor is a drain of the second transistor, and the first transistor and the second transistor form a common drain configuration.

4. The signal receiver as claimed in claim 1, wherein each of the first resistor and the second resistor comprises:
a plurality of unit resistors; and
a plurality of switches, respectively coupled with the unit resistors in series to form a plurality of resistor and switch strings, wherein the resistor and switch strings are coupled in parallel,
wherein each of the switches is turned-on or cut-off according to a plurality of bits of the adjusting signal.

5. The signal receiver as claimed in claim 1, wherein each of the first resistor and the second resistor comprises:
a plurality of unit resistors, coupled in series; and
a plurality of switches, respectively coupled with the unit resistors in parallel,
wherein each of the switches is turned-on or cut-off according to a plurality of bits of the adjusting signal.

6. The signal receiver as claimed in claim 1, further comprising:
- a third resistor, having a first terminal coupled to the second end of the first transistor;
- a fourth resistor, having a first terminal coupled to the to second end of the second transistor, wherein a second terminal of the first resistor and a second terminal of the second resistor coupled together to carry out a common-mode voltage;
- a voltage comparator, having a first input terminal coupled to the second terminal of the first resistor and the second terminal of the second resistor for receiving the common-mode voltage and a second input terminal for receiving a reference voltage, and configured to generate a control signal by comparing the common-mode voltage with the reference voltage,
- wherein resistances of the first resistor and the second resistor are adjusted according to the control signal.

7. The signal receiver as claimed in claim 6, further comprising:
- a finite state machine, coupled to the voltage comparator, perform a logic operation on the control signal to generate the adjusting signal, wherein the adjusting signal is transmitted to the first resistor and the second resistor to control resistances of the first resistor and the second resistor.

8. The signal receiver as claimed in claim 7, wherein if the common-mode voltage is larger than the reference voltage, the finite state machine generates the adjusting signal to increase the resistances of the first resistor and the second resistor.

9. The signal receiver as claimed in claim 6, further comprising:
- a finite state machine, coupled to the voltage comparator, perform a logic operation on the control signal to generate the adjusting signal, wherein the adjusting signal is transmitted to the first current source and the second current source to control the first current and the second current.

10. The signal receiver as claimed in claim 9, wherein if the common-mode voltage is larger than the reference voltage, the finite state machine generates the adjusting signal to increase the first current and the second current.

11. The signal receiver as claimed in claim 1, wherein the amplifying circuit comprises:
- a rail to rail amplifier, generating an output signal pair according to the first signal and the second signal; and
- a differential-in and single-ended output amplifier, coupled to the rail to rail amplifier, generating the output signal according to the output signal pair,
- wherein the output signal transits between the power voltage and the reference ground voltage.

12. The signal receiver as claimed in claim 11, wherein the differential-in and single-ended output amplifier and the rail to rail amplifier receive the power voltage to be an operation power.

13. The signal receiver as claimed in claim 1, further comprising:
- a third transistor, coupled between the power voltage and the first end of the first transistor, a control end of the third voltage receiving the reference ground voltage; and
- a fourth transistor, coupled between the power voltage and the first end of the second transistor, a control end of the fourth voltage receiving the reference ground voltage,
- wherein the sources of the third transistor and the fourth transistor receive the power voltage, and drains of the third transistor and the fourth transistor are respectively coupled to the first ends of the first transistor and the second transistor.

* * * * *